United States Patent [19]
Sudo et al.

[11] Patent Number: 5,475,264
[45] Date of Patent: Dec. 12, 1995

[54] ARRANGEMENT HAVING MULTILEVEL WIRING STRUCTURE USED FOR ELECTRONIC COMPONENT MODULE

[75] Inventors: Toshio Sudo; Kenji Ito, both of Kawasaki, Japan

[73] Assignee: Kabushiki Kaisha Toshiba, Kawasaki, Japan

[21] Appl. No.: 98,074

[22] Filed: Jul. 28, 1993

[30] Foreign Application Priority Data

Jul. 30, 1992 [JP] Japan .................................. 4-203856
Apr. 9, 1993 [JP] Japan .................................. 5-083573

[51] Int. Cl.$^6$ .................................................. H01L 39/02
[52] U.S. Cl. ........................... 257/723; 257/724; 257/758
[58] Field of Search .................................... 257/758, 723, 257/685, 723, 758, 685, 700, 724

[56] References Cited

U.S. PATENT DOCUMENTS

| 4,721,831 | 1/1988 | Vora ................................... 257/723 |
| 4,954,877 | 9/1990 | Nakanishi et al. ................. 257/698 |

FOREIGN PATENT DOCUMENTS

| 1191461 | 8/1989 | Japan . |
| 3105954 | 5/1991 | Japan . |
| 3-53795 | 8/1991 | Japan . |

OTHER PUBLICATIONS

"A Comparison of Thin Film, Thick Film, And Co-Fired High Density Ceramic Multilayer With The Combined Technology: T&T HDCM (Thin Film and Thick Film High Density Ceramic Module)", Terasawa et al., Proceedings of ISHM, pp. 607–615 (1983).

Primary Examiner—William Mintel
Assistant Examiner—Roy Potter
Attorney, Agent, or Firm—Finnegan, Henderson, Farabow, Garrett & Dunner

[57] ABSTRACT

According to this invention, there is provided a multilevel wiring substrate comprising, a base substrate having first and second surface and including first and second areas, said first area including first and second level conductive layers insulated from each other, a plurality of first vertical conductive layers electrically connected to said first level conductive layer so as to provide first end portions exposed to said first surface, and a plurality of second vertical conductive layers electrically connected to said second level conductive layer so as to provide second end portions exposed to said first surface, said first and second end portions being alternately arranged in row and column directions, and said second area including third and fourth conductive layers.

10 Claims, 11 Drawing Sheets

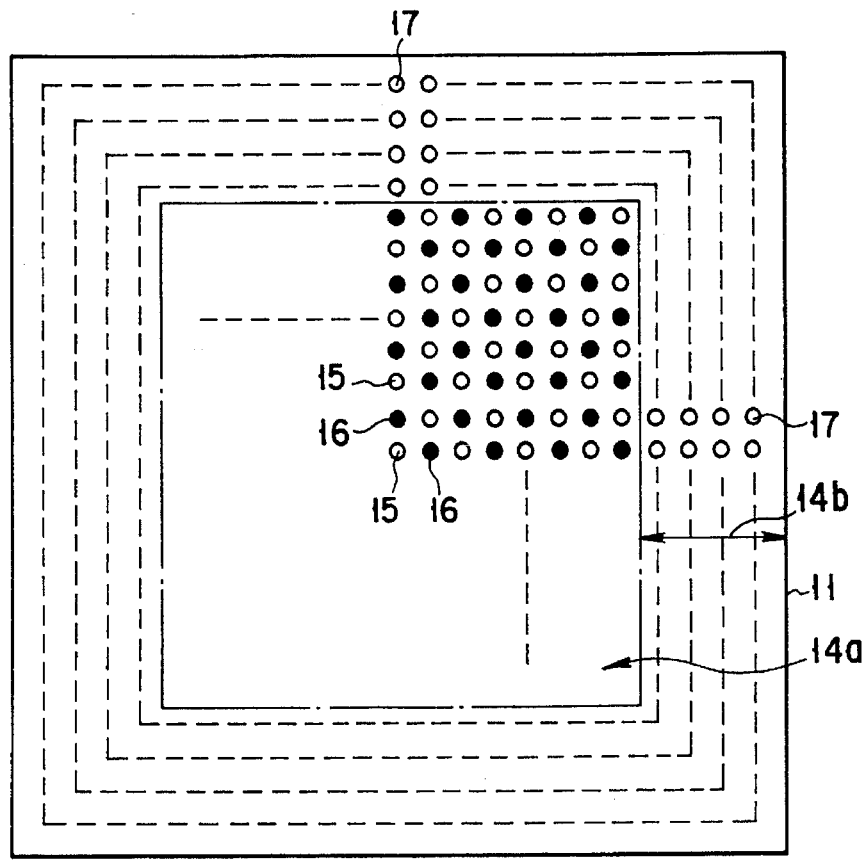
F I G. 1
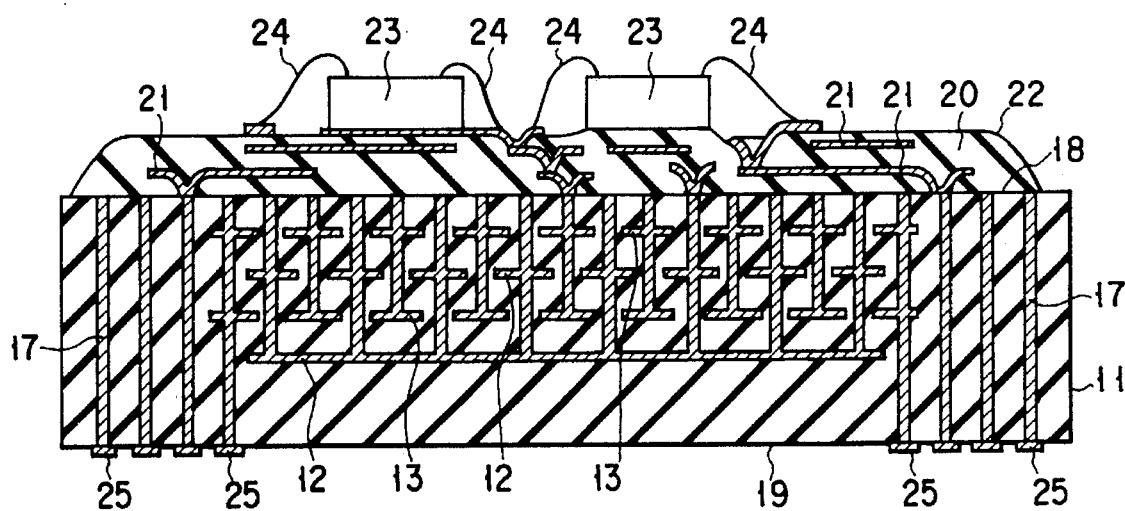
F I G. 2

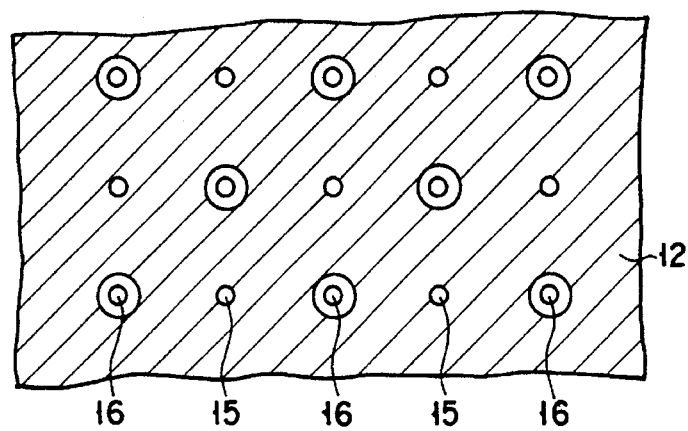
F I G. 3
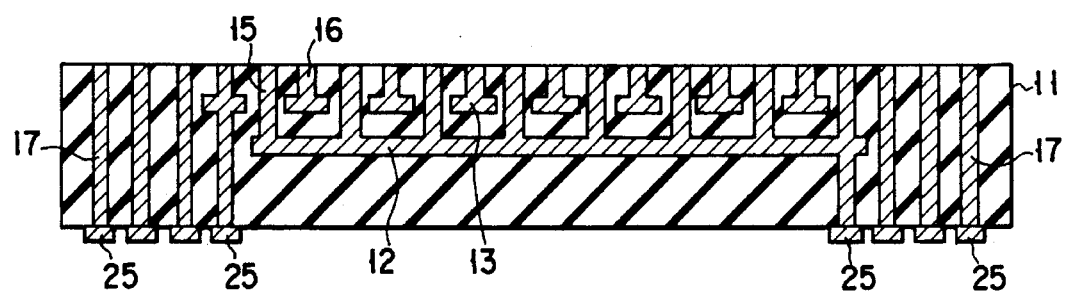
F I G. 4
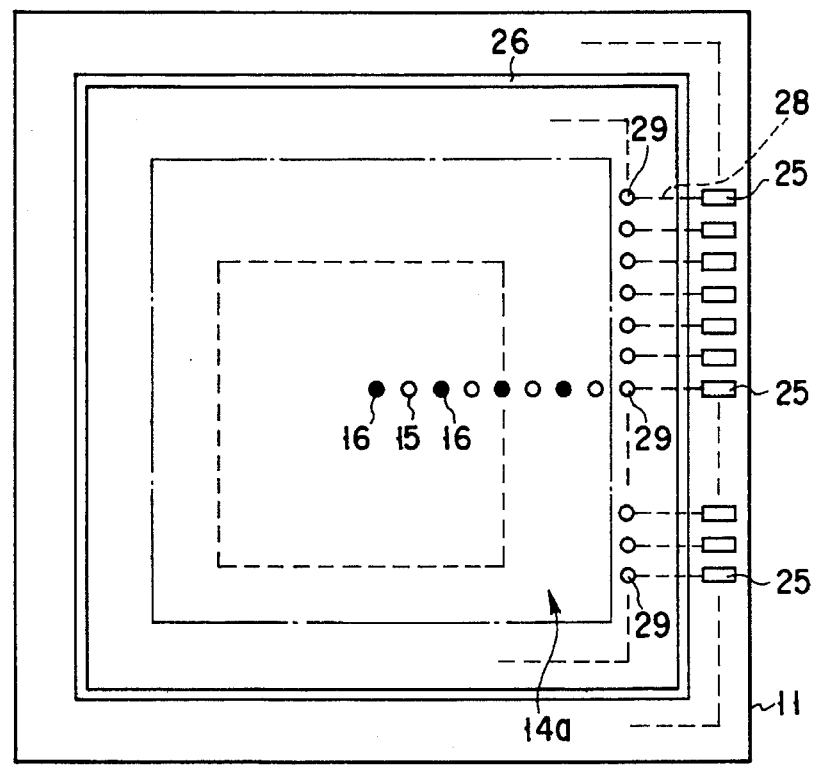
F I G. 5

ARRANGEMENT HAVING MULTILEVEL WIRING STRUCTURE USED FOR ELECTRONIC COMPONENT MODULE

BACKGROUND OF THE INVENTION

1. Field of the Invention

The present invention relates to a multilevel wiring substrate used to mount a semiconductor multi-chip module, a semiconductor device using the multilevel wiring substrate, and a method of making the multilevel wiring substrate.

2. Description of the Related Art

In recent years, LSIs each having a high integration density and high speed have been developed as the rapid progress of the semiconductor technique when a computer or communication equipment is to be constituted by these high-performance LSIs, the mounting delay of signals transmitted between the LSIs causes the system performance having the LSIs to limit.

As a means for solving the above problem, an MCM (Multi Chip Module) in which bare-chip LSIs are mounted at a high density has been popularly developed. The MCMs are classified, depending on the types of substrates used in the MCMs, into an MCM-L in which bare chips are directly mounted on a printed board, an MCM-C which uses a ceramic substrate obtained such that ceramic thin films called green sheets are stacked and then sintered, and an MCM-D which uses a thin film multilevel wiring substrate. Of these types, the MCM-D is attractive due to its electrical characteristics, wiring density, and the like.

In the MCM-D, a base substrate serving as a base is required for forming a thin film multilevel wiring layer. A silicon wafer, a metal plate consisting of aluminum or the like, or a ceramic substrate consisting of alumina, aluminum nitride, or the like is used as the base substrate. When the ceramic substrate is used as the base substrate, a wiring layer can be formed inside the base substrate, and the base substrate can also be used as a package, thereby increasing a mounting density.

The base substrate using the ceramic substrate is conventionally used in a high-end field as of a super computer, where the high cost of the base substrate is permitted. However, when this technique is applied to a workstation or a personal computer, various types of base substrates must be made within a short period of time, and the cost must be decreased.

In a base substrate used in a conventional MCM, a wiring conductive pattern, an insulating layer, and via holes must be formed for each layer. Since this process is sequential, it takes a long time to complete the base substrate, and it is difficult to reduce the cost.

SUMMARY OF THE INVENTION

It is, therefore, an object of the present invention to provide a multilevel wiring substrate capable of decreasing cost and shortening the time required for making the multilevel wiring substrate.

It is another object of the present invention to provide a multilevel wiring substrate having a base substrate formed by a simple process.

It is still another object of the present invention to provide the base substrate, serving as a semi-custom substrate, in which power-supply/ground wiring layers are formed in advance.

It is still another object of the present invention to provide a semiconductor assembly using the multilevel wiring substrate.

According to one aspect of the present invention, a multilevel wiring substrate comprises a base substrate in which power-supply and ground face conductive patterns are alternately stacked through insulating layers, a plurality of power-supply vertical conductive layers and a plurality of ground vertical conductive layers which are respectively electrically connected to the power-supply and ground face conductive patterns, regularly alternately arranged at a central area of the base substrate, and formed to extend through the base substrate, and a multilevel thin film wiring layers formed on a major surface of the base substrate and having power-supply and ground thin film wiring layers which are selectively connected to the power-supply and ground vertical conductive layers, and signal thin film wiring layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a plan view showing a base substrate constituting multilevel wiring substrate according to the first embodiment;

FIG. 2 is a cross-sectional view showing the structure of a semiconductor assembly using the multilevel wiring substrate in FIG. 1;

FIG. 3 is a plan view showing a face conductive pattern formed on an insulating sheet constituting the base substrate in FIG. 1;

FIG. 4 is a cross-sectional view showing a base substrate constituting a multilevel wiring substrate according to the second embodiment;

FIG. 5 is a plan view showing a base substrate constituting a multilevel wiring substrate according the third embodiment;

DETAILED DESCRIPTION OF THE PREFERRED EMBODIMENTS

Figure 6:
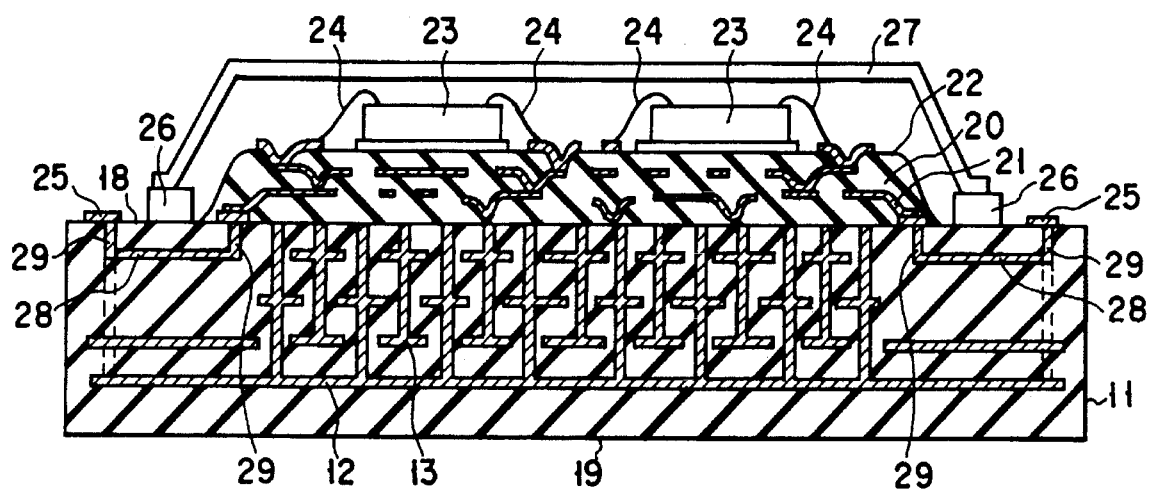
FIG. 6 is a cross-sectional view showing the structure of a semiconductor assembly using the multilevel wiring substrate in FIG. 5.

Embodiments of the present invention will be described below with reference to the accompanying drawings. Note that the same reference numerals throughout in the drawings denote the same parts, FIG. 1 is a plane view showing the pattern of the structure of a base substrate according to the first embodiment of the present invention, and FIG. 2 is a cross-sectional view showing the structure of a semiconductor assembly constituted by using the base substrate in FIG. 1.

A base substrate 11 in FIG. 1 is formed as follows. For example, a tungsten paste is screen-printed on the surfaces of a plurality of insulating sheets called ceramic green sheets consisting of, e.g., alumina ($Al_2O_3$), aluminum nitride (AlN), or the like so as to form face conductive patterns, and these insulating sheets are stacked and then sintered by using a sintering technique.

The face conductive patterns formed on the surfaces of the plurality of insulating sheets include two types of patterns, i.e., a face conductive pattern 12 to be connected to a power supply voltage and a face conductive pattern 13 to be connected to a ground voltage (reference voltage). Two green sheets on which the power-supply face conductive patterns are formed and two green sheets on which the ground face conductive patterns are formed are prepared in advance, these green sheets are alternately stacked in the direction of thickness such that capacitors are formed between the face conductive patterns, and then the stacked green sheets are sintered.

The central area 14a of the base substrate 11 is a region in which the power-supply and ground face conductive patterns 12 and 13 are formed. In the central area 14a, vertical conductive path 15 (shown hollow circles in FIG. 1) connected to the power-supply face conductive pattern 12 and vertical conductive path 16 (shown solid circles in FIG. 1) connected to the ground face conductive pattern 13 are regularly and alternately arranged. A plurality of conductive path 17 for externally extracting signal wiring lines and power-supply/ground wiring lines are arranged in the peripheral area 14b of the base substrate 11.

The vertical conductive paths 15, 16, and 17 each are vertically and electrically connected as follows, via holes formed in the insulating sheet of each of the layers are filled with a tungsten paste, the insulating sheets are stacked and sintered. Therefore, the power-supply face conductive patterns 12 on the insulating layers are electrically connected to each other by the vertical conductive paths 15, and similarly, the ground face conductive patterns 13 are electrically connected to each other by the vertical conductive paths 16.

In the base substrate 11 shown in FIG. 2, an upper surface 18 is used as a major surface serving as a thin film wiring formation surface, and a lower surface 19 is used as an external terminal extraction surface. The end faces of the power-supply vertical conductive paths 15, the ground vertical conductive paths 16, and the conductive paths 17 are exposed on the upper surface 18. In addition, the surface of the insulating sheet on the upper surface 18 side is polished. Pad electrodes (not shown) for connecting a multilevel thin film wiring layers 22 (to be described later) are formed on the exposed portions of the conductive paths 15, 16, and 17 on the insulating sheet surface on the upper surface 18 side.

The multilevel thin film wiring layers 22 is formed on the upper surface 18 of the base substrate 11. The multilevel thin film wiring layers 22 comprises a polyimide insulating layer 20 and a thin film wiring layer 21 having a copper layer and a barrier metal. The barrier metal consists of a titanium layer or a chromium layer for improving the adhesion between the polyimide insulating layer 20 and the copper layer. The base substrate 11 and the multilevel thin film wiring layers 22 constitute a multilevel wiring substrate.

A plurality of semiconductor chips, e.g., LSI chips 23, are mounted on the multilevel thin film wiring layers 22. A power-supply voltage electrode, a ground voltage electrode, and a signal electrode (pad electrodes) (not shown) are formed on the upper surface of the each LSI chips 23. The electrodes on the LSI chip 23 are electrically connected, through bonding wires 24 and the thin film wiring layer 21 in the multi-level thin film wiring layers 22, to the vertical conductive paths 15 and 16 which are closest to the corresponding LSI chip 23, and the electrodes are also connected to the vertical conductive paths 17.

In other words, some of the conductive paths 17 arranged in the peripheral area 14b of the base substrate 11 are directly connected to the power-supply face conductive patterns 12 or the ground face conductive pattern 13 inside the base substrate 11, respectively. A power supply voltage or a ground voltage is externally applied to the face conductive patterns 12 and 13 through the conductive paths 17, and is then applied to each of the LSI chips 23 through the vertical conductive paths 15 and 16, the thin film wiring layer 21, and the bonding wires 24. Signals are exchanged between each LSI chip 23 and an external circuit through some of the conductive paths 17, the thin film wiring layer 21, and the bonding wires 24.

Lead pins are brazed or pad electrodes brought into contact with a connector are formed on the lower surface 19 of the base substrate 11. In this embodiment, pad electrodes 25 are arranged on the lower surface 19.

FIG. 3 is a plan view showing the shape of the power-supply face conductive pattern 12 formed on the insulating sheet constituting the base substrate 11. In FIG. 3, the hatched region is the face conductive pattern 12 formed such that a tungsten paste is printed and then sintered. The power supply face conductive pattern 12 is not formed around the ground vertical conductive paths 16 not to short-circuit the vertical conductive paths 16 to each other. In addition, the ground face conductive pattern 13 is formed in the same manner as the formation of the power-supply face conductive patterns 12.

In the multilevel wiring substrate arranged as described above, when various types of MCMs are to be formed, in accordance with the arbitrary arrangement and arbitrary sizes of LSI chips for each application, the power-supply and ground wiring lines of the LSI chips can be connected through the thin film wiring layers 21 for power supply and ground, which are connected to the closest vertical conductive paths 15 and 16 arranged in the base substrate 11, so that unwanted inductance present in the multilevel thin film wiring layers 22 is sufficiently decreased. Signal wiring lines serve as wiring lines for connecting LSI chips to each other and wiring lines for connecting the LSI chips to an external circuit. The signal wiring lines in the multilevel thin film wiring layers may be formed of the thin film wiring layers 21 having at least two-signal layer structure. For this reason, various types of MCMs can be provided at low cost within a shorter making time which than that of the prior art.

In this embodiment, a case wherein a power supply system has two potentials (a power supply potential and a ground potential) has been described when a power supply system to be used has two or more potentials, potential layers formed in the multilevel thin film wiring layers are increased. Therefore, vertical conductive paths for these potential layers may be alternately arranged in the base substrate.

FIG. 4 is a cross-sectional view showing the structure of a multilevel wiring substrate according to the second embodiment of the present invention. In the description of the base substrate 11 according to the first embodiment, the two face conductive patterns 12 to be connected to the power supply voltage and the two face conductive patterns 13 to be connected to the ground voltage are arranged. In a base substrate 11 according to the second embodiment, one face conductive pattern 12 to be connected to a power supply voltage and one face conductive pattern 13 to be connected to a ground voltage are arranged.

The multilevel wiring substrate of the embodiment shown in FIG. 4 can be practically used. However, when the number of layers of the face conductive patterns 12 and 13 are increased, capacitors each having a larger capacitance are formed so as to reduce power supply noise and to increase a DC current supply capability in a normal operation.

FIG. 5 is a plan view showing the pattern of the structure of a base substrate according to the third embodiment, and FIG. 6 is a cross-sectional view showing the structure of a semiconductor assembly constituted by using the base substrate in FIG. 5. In this embodiment, a base substrate 11 in this embodiment which is different from the base substrate shown in FIG. 1 will only be described below. That is, in this embodiment, pad electrodes 25 used as external terminals are arranged in the outer peripheral portion on an upper surface 18 side of the base substrate 11. A shield ring metal 26 is formed on the upper surface 18 of the base substrate 11, and a lid 27 is welded on the ring metal 26 by a seam welding method or a laser welding method, thereby performing hermetical sealing.

In addition, detour wiring lines 28 consisting of tungsten are formed below the ring metal 26 and inside the base substrate 11, and conductive paths 29 are formed inside the base substrate 11, so as to connect the conductive paths 29 of signal wiring lines to the pad electrodes 25.

A plurality of power-supply and ground vertical conductive paths are arranged in the central portion on the upper surface 18 side of the base substrate 11, and face conductive patterns 12 and 13 are directly connected to these vertical conductive paths.

As in the base substrate 11 of this embodiment, when the pad electrodes 25 are formed on the upper surface 18, a heat sink (not shown) can be arranged on a lower surface 19 of the base substrate 11 by using grease having a high thermal conductivity. The thermal conductivity of aluminum nitride (AlN) serving as the material of the insulating sheet of each layer in the base substrate is almost ten times that of alumina ($Al_2O_3$). That is, the thermal conductivity of aluminum nitride is about 170 (°C./Wm), and the thermal conductivity of alumina is about 15 (°C./Wm). For this reason, when the heat sink are arranged, the cooling capability can be increased. In addition, in order to decrease the thermal resistance of a multilevel thin film wiring layers 22, so-called thermal via holes are more effectively formed in a polyimide insulating layer 20.

Figure 7:
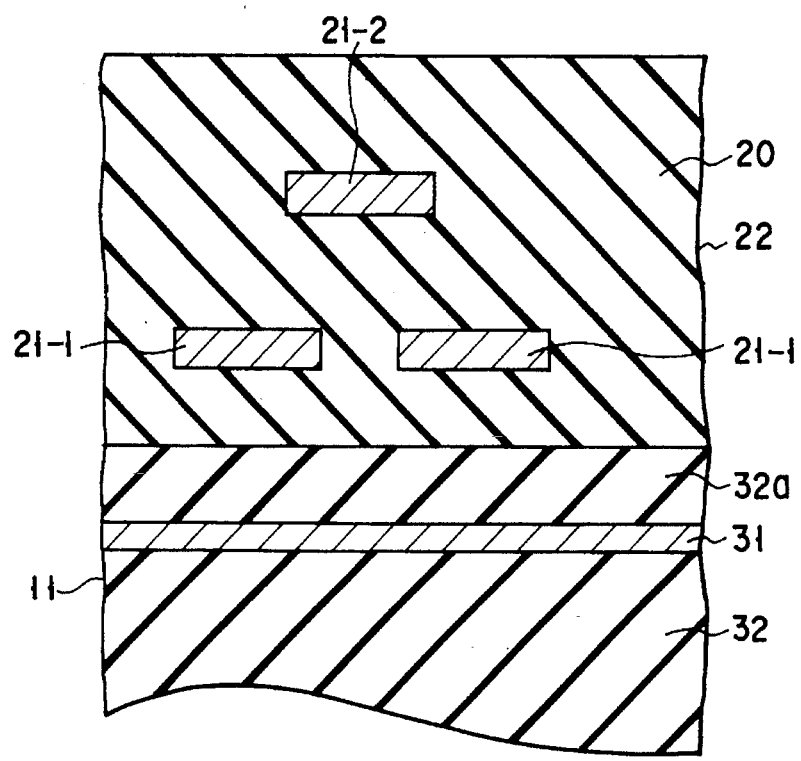
FIG. 7 is an enlarged sectional view showing the upper surface side of the base substrate and a thin film wiring portion formed on the base substrate.

FIG. 7 is an enlarged cross-sectional view showing the upper surface 18 of the multilevel wiring substrate of each of the above embodiments. The base substrate constituting the multilevel wiring substrate comprises a plurality of face conductive patterns 31 consisting of tungsten and corresponding to the above face conductive patterns 12 and 13, insulating sheets 32 arranged between the face conductive patterns 31, and an insulating sheet 32a arranged on the upper surface 18 side. The surface of the insulating sheet 32a is polished as described above, and the insulating sheet 32a is formed to have a thickness thinner than that of each of other insulating sheets 32. A first thin film wiring layer 21-1 and a second thin film wiring layer 21-2 respectively consisting of copper and a barrier metal are formed in the polyimide insulating layer 20 of the multilevel thin film wiring layers 22.

In this manner, when the insulating sheet 32a having a thin thickness is arranged on the uppermost surface of the base substrate, the characteristic impedance of the signal wiring lines in the thin film wiring portion 22 can easily be controlled. As a result, crosstalk noise between the wiring lines can easily be reduced. In other words, the characteristic impedance of the signal wiring lines in the multilevel thin film wiring layers 22 is controlled by adjusting the width of each wiring line and the thickness of the insulating sheet 32a, i.e., the distance between the signal wiring lines and the face conductive pattern 31 applied with a ground voltage.

In the above description, the thickness of the insulating sheet 32a is decreased by polishing its surface on the major surface side. However, the following method may be used. That is, a green sheet for the insulating sheet 32a is formed having a thickness thinner than that of each of green sheets for the insulating sheets 32 in advance, and these green sheets are stacked and integrally sintered.

Figure 8:
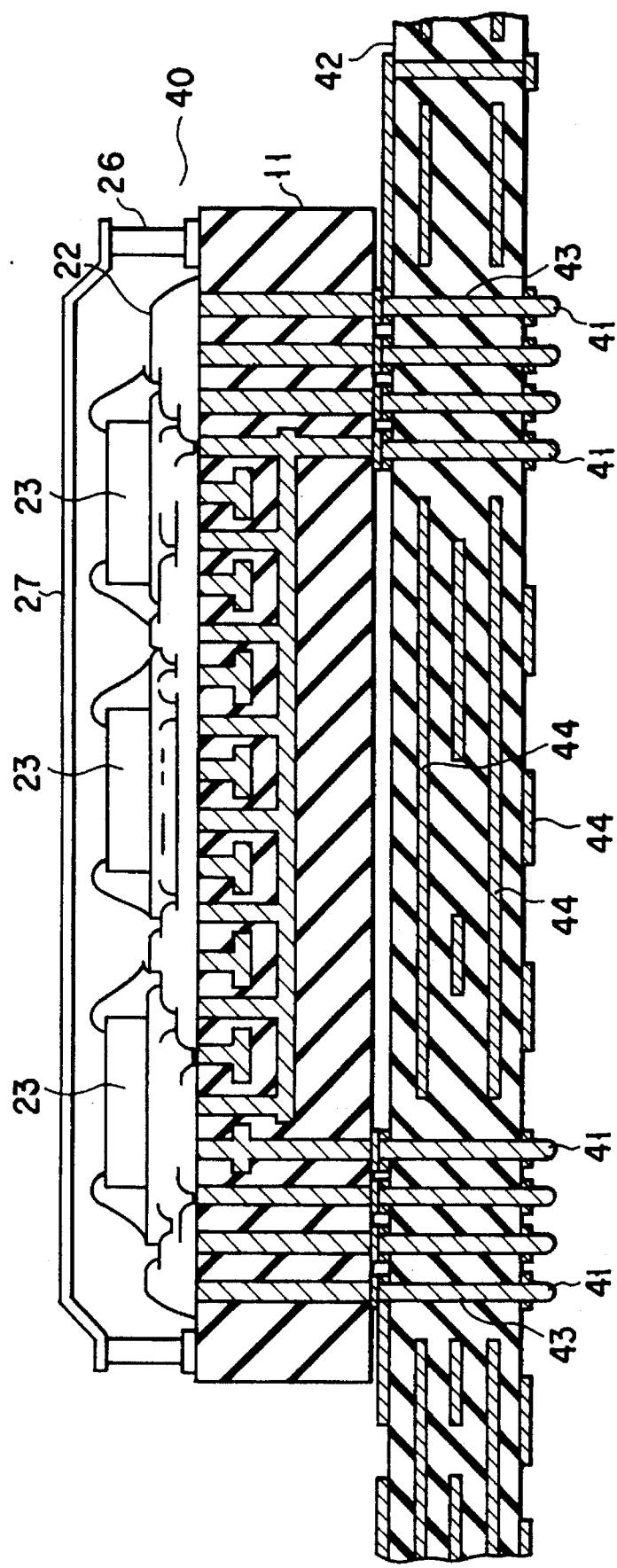
FIG. 8 is a cross-sectional view showing the structure of a semiconductor assembly according to the fourth embodiment.

FIG. 8 is a cross-sectional view showing the structure of a semiconductor assembly according to the fourth embodiment of the present invention. In the assembly of this embodiment comprises an MCM 40, and a multilevel printed board 42 on which the MCM 40 is mounted. The MCM 40 consists of a base substrate 11, a multilevel thin film wiring layers 22 formed on the base substrate 11 and a plurality of LSI chips 23 mounted on the multilevel thin film wiring layers 22, is air-tightly sealed by using a ring metal 26 and a lid 27. The MCM 40 is mounted such that lead pins 41 formed on lower surface of the base substrate 11 of the MCM 40 are inserted into through holes 43 of the printed board 42. Note that reference numeral 44 denotes a wiring pattern of the printed board 42.

Figure 9:
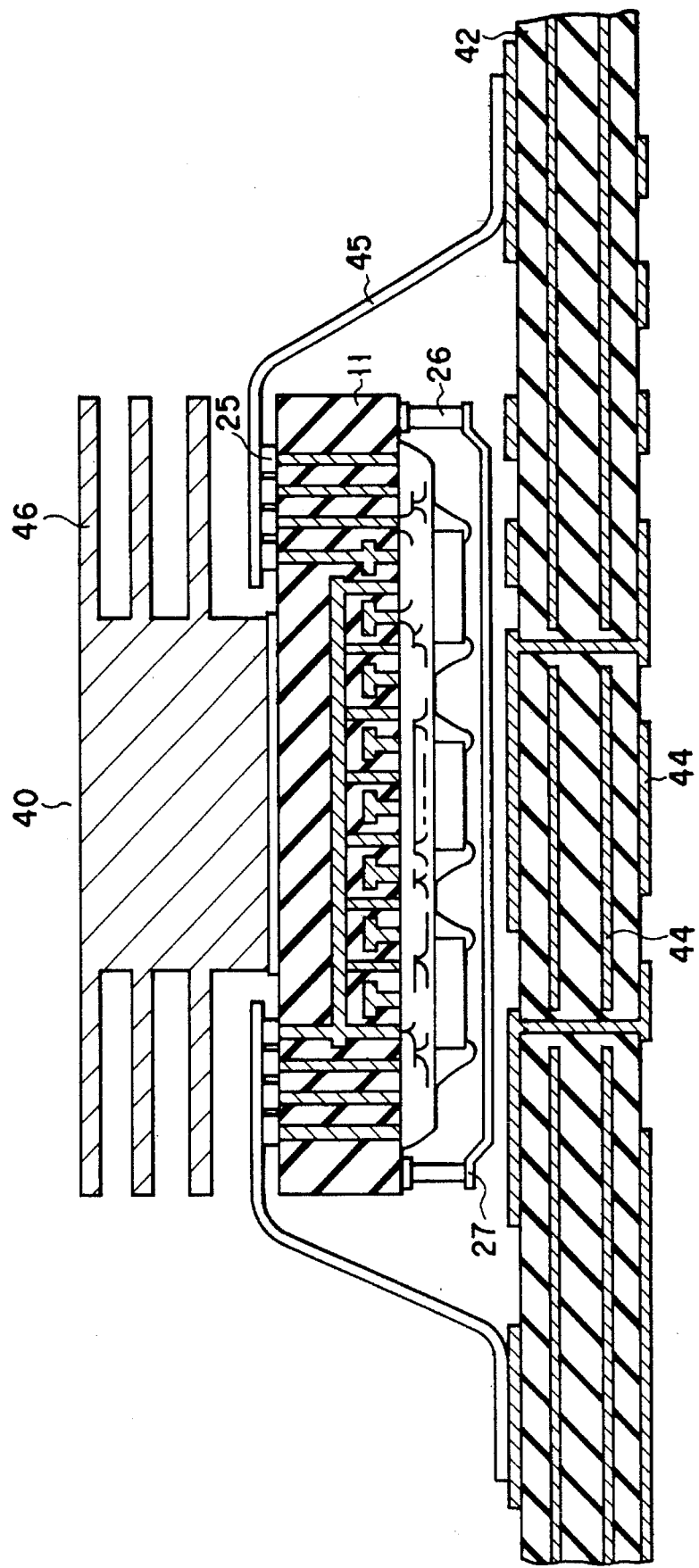
FIG. 9 is a cross-sectional view showing the structure of a semiconductor assembly according to the fifth embodiment.

FIG. 9 is a cross-sectional view showing the structure of a semiconductor assembly according to the fifth embodiment of the present invention. In the assembly of this embodiment, a base substrate is mounted such that its LSI chip mounting surface opposes to a printed board 42. Flexible flat cables 45 are used to connect the printed board 42 to pad electrodes 25 serving as the external terminals of an MCM 40. A base substrate 11 of the MCM 40 is supported at its corners by spacers (not shown) or the like. In addition, a heat sink 46 are arranged on the surface of the ceramic base substrate 11 opposite to the LSI chip mounting surface.

Figure 10:
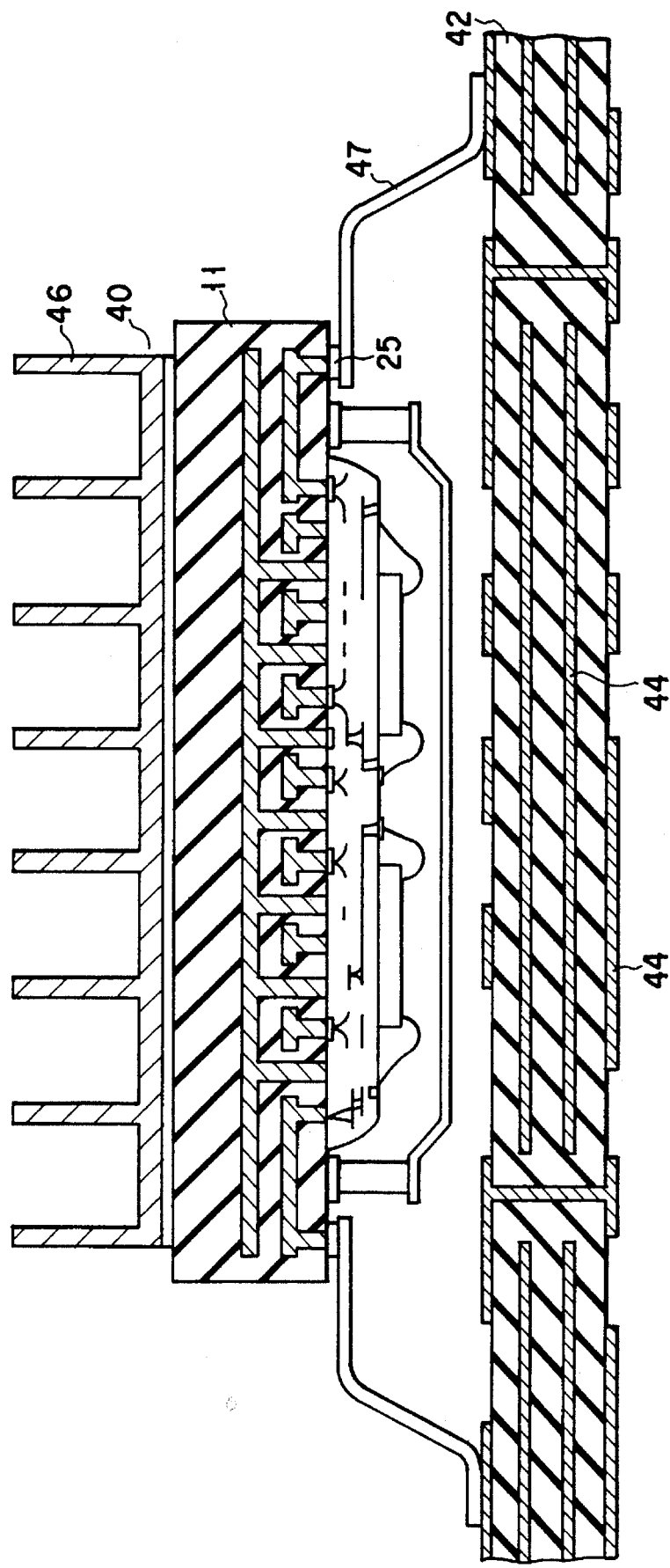
FIG. 10 is a cross-sectional view showing the structure of a semiconductor assembly according to the sixth embodiment.

FIG. 10 is a cross-sectional view showing the structure of a semiconductor assembly according to the sixth embodiment of the present invention. In the device of this embodiment, a base substrate of the same type as that of the base substrate shown in FIG. 6 is used as a base substrate 11, lead frames 47 formed by punching or etching a metal thin film is used to connect a printed board 42 to pad electrodes 25 serving as the external terminals of the base substrate 11. In this case, a heat sink 46 are arranged on the surface of the base substrate 11 opposite to the LSI chip mounting surface of the base substrate 11. Heat generated by each of LSI chips 23 is transmitted to the heat sink 46 through the base substrate 11. At this time, since aluminum nitride has a thermal resistance lower than that of alumina, when the base substrate is formed by using a green sheet consisting of aluminum nitride, heat can be effectively radiated.

Figure 11:
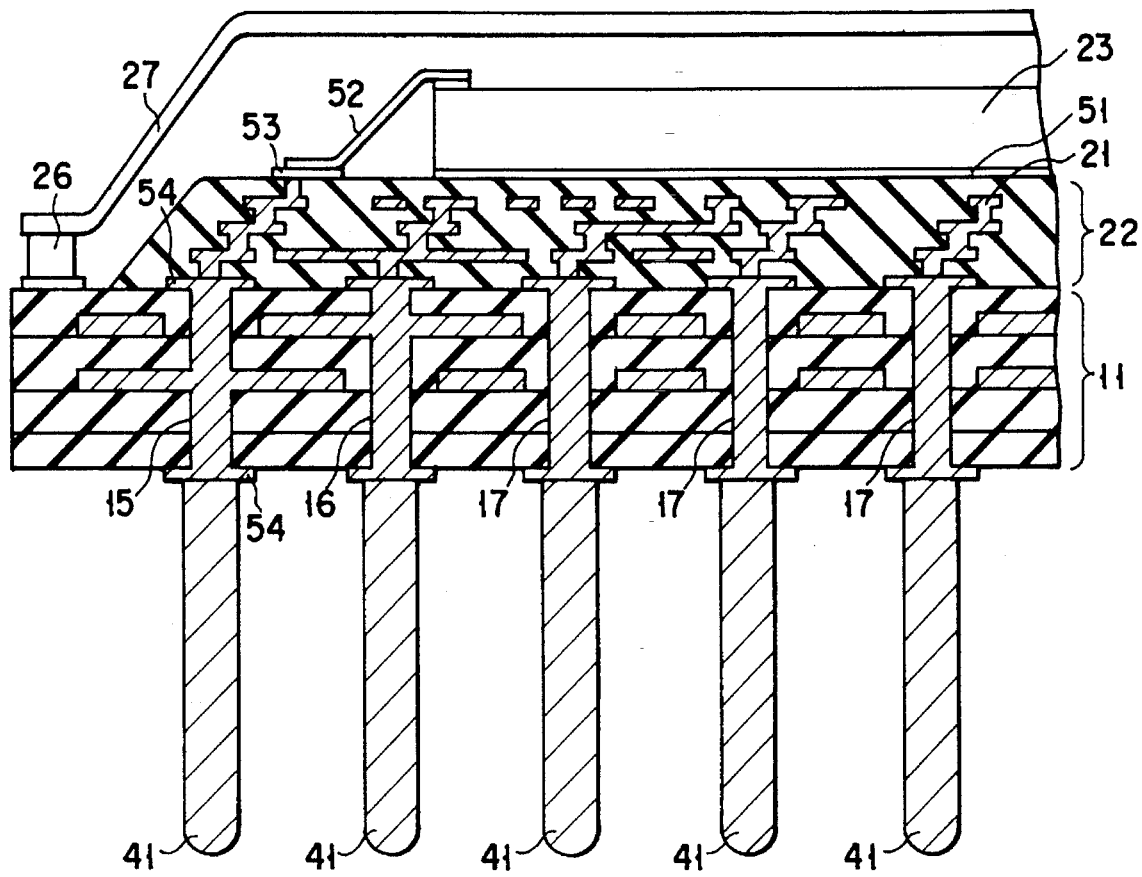
FIG. 11 is a cross-sectional view showing part of the structure of a semiconductor assembly according to the seventh embodiment.

FIG. 11 is a cross-sectional view showing a semiconductor assembly according to the seventh embodiment of the present invention. The assembly of this embodiment comprises a base substrate 11 constituted by using ceramic green sheets, a multilevel thin film wiring layers 22 formed on the base substrate 11, and an LSI chip 23 mounted on the multilevel thin film wiring layers 22 through an adhesive layer 51, and the LSI chip 23 is air-tightly sealed by a ring metal 26 and a lid 27.

According to this embodiment, electrodes (pad electrodes) on the LSI chip 23 are connected to bonding pads 53 on the multilevel thin film wiring layers 22 by a TAB (Tape Automated Bonding) technique using lead frames 52.

In this embodiment, power-supply vertical conductive paths 15, ground vertical conductive paths 16, and signal vertical conductive paths 17 are formed in the base substrate 11. Pad electrodes 54 connected to each of the vertical conductive paths are formed on both the surfaces of the base substrate 11. The pad electrodes 54 formed on the multilevel thin film wiring layers 22 side are selectively connected to thin film wiring layer 21 of the multilevel thin film wiring layers 22, and the lead pins 41 are brazed on the pad electrodes 54 formed on the surface of the base substrate 11 opposite to the multilevel thin film wiring layers 22.

The base substrate 11 used in this embodiment is formed as follows. The base substrate 11 is formed to be cut a required size from a large-area original in which the power-supply, ground, and signal vertical conductive paths 15, 16, and 17 are formed at a predetermined ratio, and in which the pad electrodes 54 connected to these vertical conductive paths are formed.

Figure 12:
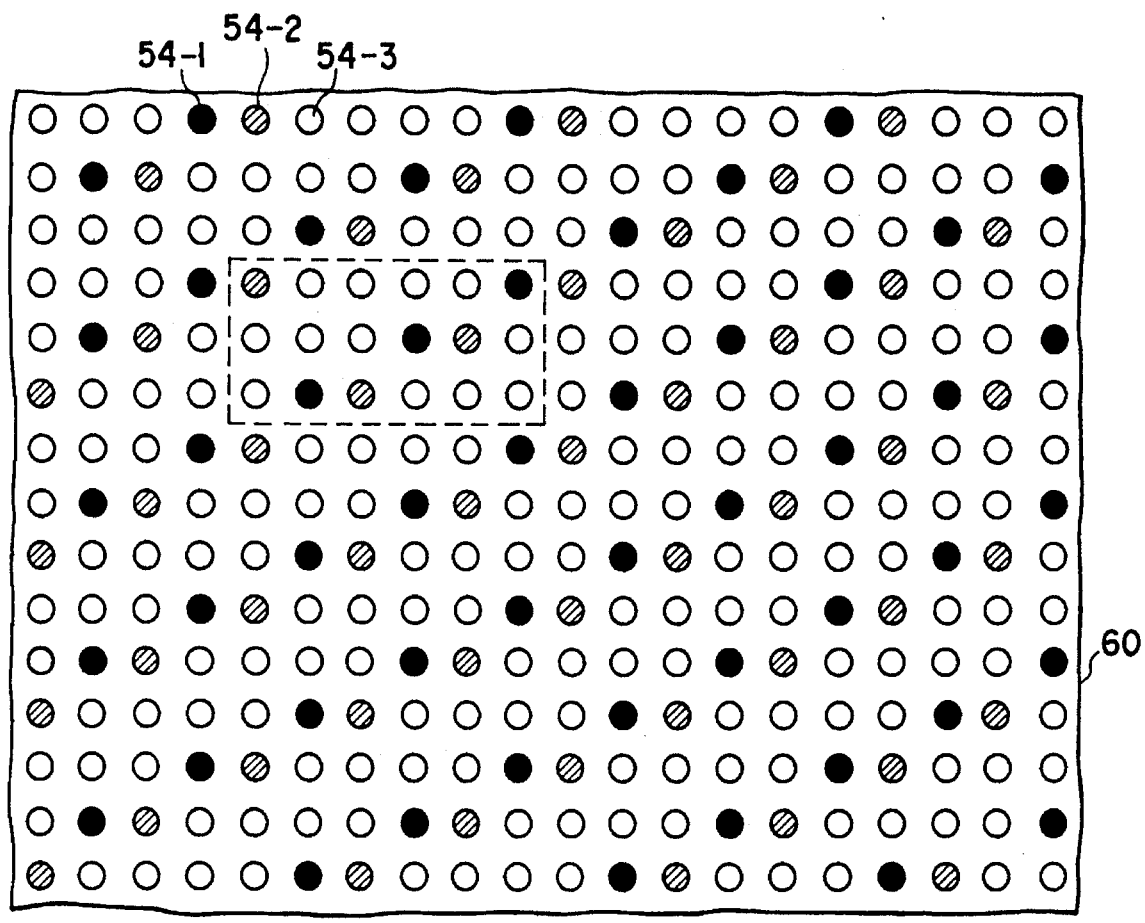
FIG. 12 is a plane view showing an original substrate for forming a base substrate used in the semiconductor assembly in FIG. 11.

FIG. 12 is a plan view showing the pattern of the original substrate 60. The original substrate 60 is formed as follows. That is, as in the above description, for example, a tungsten paste is screenprinted on the surface of each of a plurality of insulating sheets called ceramic green sheets consisting of, e.g., alumina ($Al_2O_3$), aluminum nitride (AlN), or the like so as to form face conductive patterns, and these green sheets are stacked and sintered by using a sintering technique. A plurality of pad electrodes are regularly formed at predetermined intervals on the surface of the original substrate 60. In FIG. 12, pad electrodes 54-1 represented by solid circles are used for a power supply voltage, pad electrodes 54-2 represented by hatched circles are used for a ground voltage, and pad electrodes 54-3 represented by hollow circles are used for a signal. A region surrounded by a dotted line in FIG. 12 is used as a basic unit, and the basic unit is repeated in the vertical and horizontal directions.

Figure 13A:
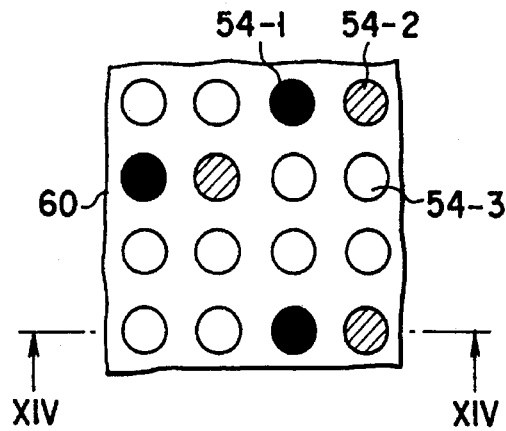
FIG. 13A is an enlarged plane view showing the pattern of a part extracted from the original substrate in FIG. 12.
Figure 13B:
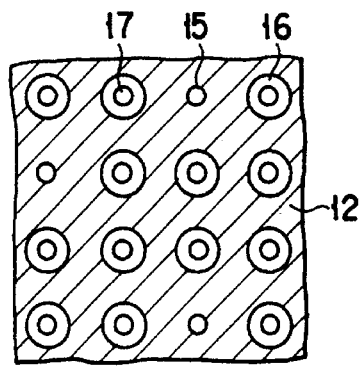
FIG. 13B is a plan view showing a power-supply face conductive pattern formed on an insulating sheet constituting the original substrate in FIG. 13A.
Figure 13C:
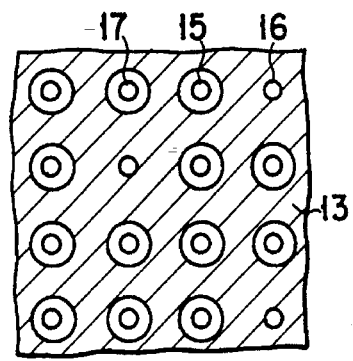
FIG. 13C is a plan view showing a ground face conductive pattern formed on the insulating sheet constituting the original substrate in FIG. 13A.
Figure 14:
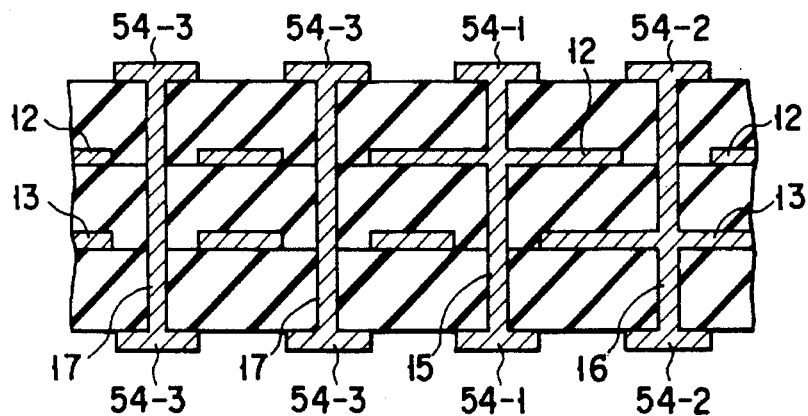
FIG. 14 is a cross-sectional view showing the original substrate along a line XIV—XIV in FIG. 13A.

FIG. 13A is an enlarged view showing a part extracted from the original substrate 60 in FIG. 12. FIG. 13B is a plan view showing the shape of a power-supply face conductive pattern formed on the insulating sheet surface of a layer constituting the original substrate 60. In FIG. 13B, a hatched region is a face conductive pattern 12 formed such that a tungsten paste is printed and then sintered, and no conductive pattern is formed around the vertical conductive paths 16 and 17 to prevent the vertical conductive paths 16 and 17 from being short-circuited to each other. FIG. 13C is a plan view showing the shape of a ground face conductive pattern formed on the insulating sheet surface of a layer constituting the original substrate 60. In FIG. 13C, a hatched region is a face conductive pattern 13 formed such that a tungsten paste is printed and then sintered, and no conductive pattern is formed around the vertical conductive paths 15 and 17 to prevent the vertical conductive paths 15 and 17 from being short-circuited to each other. FIG. 14 is a sectional view showing a case wherein the original substrate 60 is cut along a line XIV—XIV in FIG. 13A.

Figure 15:
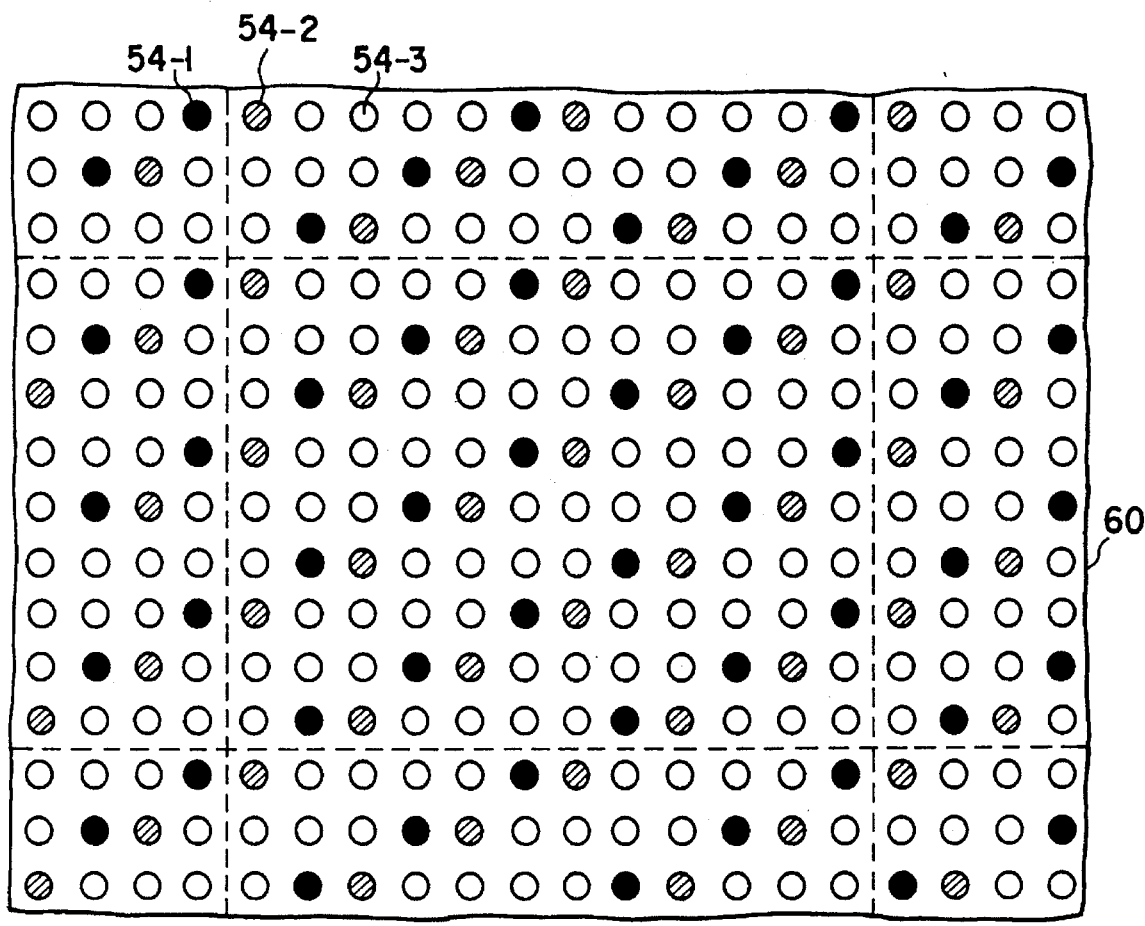
FIG. 15 is a plan view showing the pattern of an original substrate to explain a state wherein the original substrate is cut to have the size of a required base substrate.

The base substrate used in the semiconductor device shown in FIG. 11 is formed such that the original substrate 60 shown in FIG. 12 is cut to have a required size. As shown in FIG. 15, for example, the original substrate 60 is cut into each region surrounded by a dotted line, so that a large number of base substrates 11 of the same type can be formed. In addition, when the size of the region to be cut is changed, base substrates matching with different MCMs can be formed.

In this manner, when the base substrate 11 cut from the original substrate 60 having a large area is used, it is satisfactory that only one type of original substrate 60 is prepared for different MCMs, thereby considerably decreasing the cost. In the base substrate 11 cut from the original substrate 60, the positions of the power-supply, ground, and signal pad electrodes 54-1, 54-2, and 54-3 are not freely determined. However, fine-patterned wiring lines can be formed in the multilevel thin film wiring layers 22 arranged on the base substrate 11, and the arbitrary pads 54 on the base substrate 11 can be freely connected to the bonding pads 53 on the multilevel thin film wiring layers 22. Therefore, when the pad electrodes 54 on the base substrate 11 are arranged at the same pitch as that of the lead pins 41 almost regardless of the positions and sizes of the pad electrodes 54, wiring lines other than the power-supply and ground wiring lines need not be arranged inside the base substrate 11 or on the surface of the base substrate 11. In addition, when the power-supply pad electrodes 54-1, the ground pad electrodes 54-2, and the signal pad electrodes 54-3 need not be locally arranged but are uniformly arranged at a predetermined ratio, the base substrate 11 having the pad electrodes 54 can be applied to different types of MCMs. The length of each of the wiring lines is not considerably increased, and characteristics are not degraded. In addition, since the lead pins 41 are two-dimensionally arranged, even when the pitch of the lead pins 41 is not greatly decreased, a required number of input/output terminals can be assured. For this reason, the substrate size is not excessively increased.

The base substrate 11 may be cut from the original substrate 60 after the plurality of ceramic green sheets are stacked and sintered or before the stacked ceramic green sheets are sintered. The base substrate 11 can easily be cut by a punching process using a mold before the sintering is performed, and the cut individual base substrates may be sintered.

Figure 16:
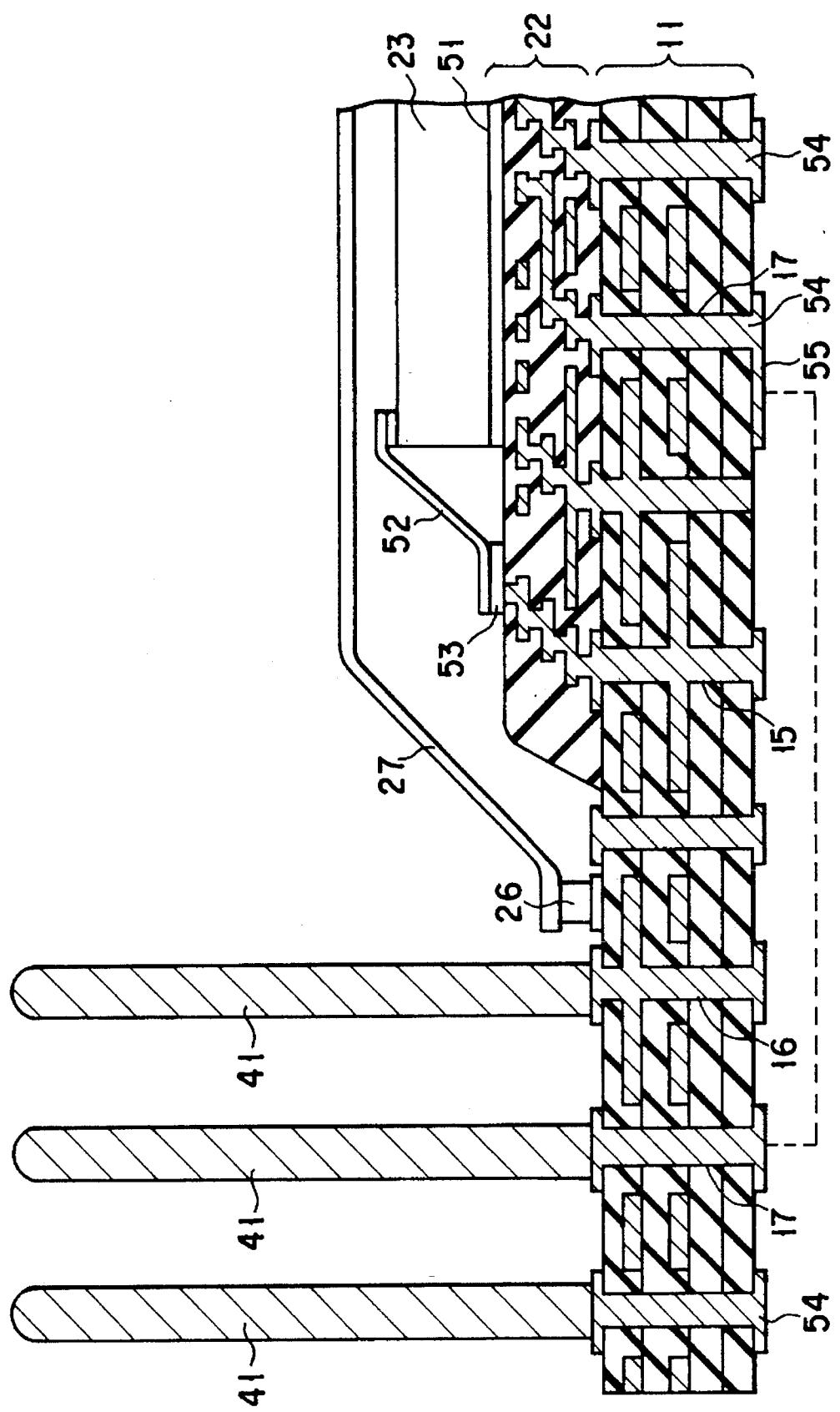
FIG. 16 is a cross-sectional view showing part of the structure of a semiconductor assembly according to the eighth embodiment.

FIG. 16 is a cross-sectional view showing a semiconductor assembly according to the eighth embodiment of the present invention. In the device of this embodiment, the present invention is applied to an MCM in which heat of a base substrate must be radiated by connecting a heat sink to the base substrate due to the large heat amount of an LSI chip. In the MCM according to this embodiment, since the heat sink must be connected to the base substrate 11, lead pins 41 extend from a surface opposite to the surface from which the lead pins 41 extend in FIG. 11, i.e., from the surface on which a multilevel thin film wiring layers 22 is formed. Therefore, in this embodiment, the lead pins 41 cannot be directly connected to signal vertical conductive paths 17. For this reason, in this embodiment, after the cut individual base substrates 11 are obtained, a wiring layer 55 is selectively formed by a thick-film technique, a thin-film technique, or a plating method on the surface of the base substrates 11 opposite to the multilevel thin film wiring layers 22, and the predetermined vertical conductive paths 17 are connected to each other through the wiring layers 55.

In this case, the base substrates 11 can be commonly used, and the base substrates 11 can cope with different MCMs by changing only the pattern shape of the wiring layer 55, thereby decreasing the cost.

The present invention is not limited to the above embodiments, and various modifications can be effected, as a matter of course. For example, in each of the above embodiments, a multilevel wiring substrate using, as a base substrate, a ceramic base substrate formed by a green sheet stacking method has been described. However, a resin substrate such as a glass epoxy substrate may be used as the base substrate.

As has been described above, the multilevel wiring substrate for making various types of multi-chip modules comprises a base substrate prepared as a semi-custom substrate in advance in a standardized form, and a multilevel thin film wiring layers in which power-supply, ground, and signal wiring layers are formed on the base substrate in accordance with applications. Therefore, the multilevel wiring substrate can be provided at low cost within a short period of time like a gate array used in an ASIC.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An arrangement having a multilevel wiring structure used for an electronic component module comprising:

a base substrate having first and second surfaces opposed each other, said substrate including first multilevel conductive patterns and first vertical conductive paths for electrical connections exposed to said first and second surfaces, said first vertical conductive paths being located at a peripheral section of said base substrate so as to surround said first multilevel conductive patterns; and a thin film wiring layer having a third surface for mounting a plurality of electronic components having arbitrary sizes at arbitrary positions respectively, and a fourth surface formed on said first surface of said base substrate, said thin film wiring layer including second multilevel conductive patterns having portions for electrical connections exposed to said third and fourth surfaces;

wherein said portions for electrical connections are selected such that electrical signals and power supply voltages supplied from said base substrate are applied to said electronic components through said thin film wiring layer; and wherein said first multilevel conductive patterns include first and second potential level conductive layers insulated from each other, a plurality of second vertical conductive paths electrically connected to said first potential level conductive layers so as to provide first end portions exposed to said first surface of said base substrate, and a plurality of third vertical conductive paths electrically connected to said second potential level conductive layers so as to provide second end portions exposed to said first surface of said base substrate, said first and second end portions being alternately arranged in row and column directions so as to provide closest connections with said electrical components through said thin film wiring layer.

2. The arrangement according to claim 1, wherein said first multilevel conductive patterns are located at a center of said base substrate.

3. The arrangement according to claim 1, wherein said first multilevel conductive patterns conduct power supply voltages.

4. The arrangement according to claim 1, wherein said first vertical conductive paths conduct signals.

5. The arrangement according to claim 1, wherein at least one of said first multilevel conductive patterns is electrically connected to at least one of said first vertical conductive paths.

6. The arrangement according to claim 1, further including an insulating layer provided in said base substrate.

7. The arrangement according to claim 6, wherein said insulating layer is alumina.

8. The arrangement according to claim 6, wherein said insulating layer is aluminum nitride.

9. The arrangement according to claim 1, wherein said electronic components are semiconductor chips.

10. The arrangement according to claim 1, wherein said electrical components include integrated circuits.

* * * * *